Figure 1:
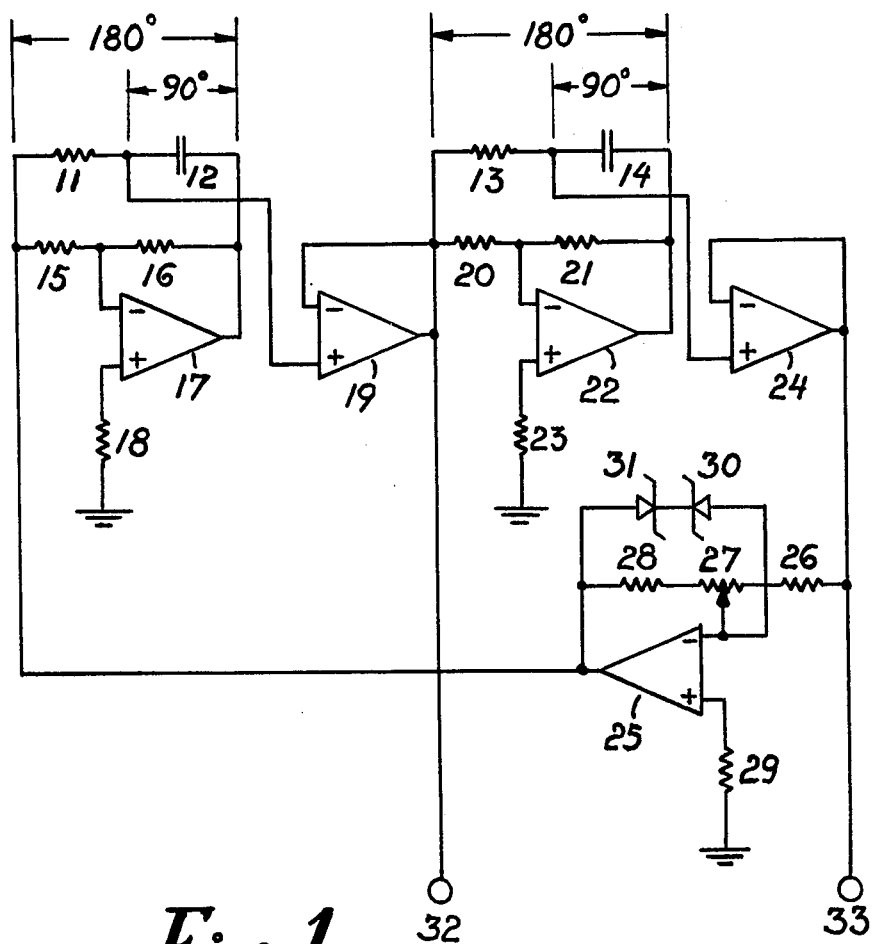

United States Patent [19]

Bode

[11] 4,145,670
[45] Mar. 20, 1979

[54] MULTIPHASE SIGNAL OSCILLATOR
[76] Inventor: Harald E. W. Bode, 1344 Abington Pl., North Tonawanda, N.Y. 14120
[21] Appl. No.: 812,508
[22] Filed: Jul. 5, 1977
[51] Int. Cl.$^2$ ............................................. H03B 5/24
[52] U.S. Cl. ................................... 331/135; 331/137
[58] Field of Search ............ 331/135, 136, 137, 108 B
[56] References Cited
FOREIGN PATENT DOCUMENTS 2500572  7/1976  Fed. Rep. of Germany .......... 331/135
2249485  10/1973  France ..................................... 331/135

Primary Examiner—John Kominski
Attorney, Agent, or Firm—Martin Lukacher

[57] ABSTRACT

This invention deals with significant innovations on multiphase signal oscillators including quadrature oscillators for the use in frequency shifters, or sequential gating devices for special multichannel sound effects, or three-phase power sources or other electronic apparatus. These innovations or the combination thereof consist of (1) the serial arrangement of two or more than two all-pass phase filter sections in a feedback loop to form an oscillator with a frequency stability and purity heretofore not attainable with cascaded integrator type quadrature or multiphase signal oscillators, (2) the inclusion of circuitry to secure an immediate start of oscillation at very low frequencies, (3) the inclusion of known means for amplitude limitation, (4) the inclusion of operational transconductance amplifiers for wide range voltage controlled frequency determination or (5) alternate types or means for frequency control including but not limited to known means for pulse width control of the frequency determining resistors.

6 Claims, 4 Drawing Figures

MULTIPHASE SIGNAL OSCILLATOR

This invention relates to an oscillator for producing multiphase audio or sub-audio signals, and more particularly it is concerned with the production of at least two output signals with a fixed phase relationship for the use in audio signal frequency shifters, or sequential gating devices for special multichannel sound effects, or three-phase power sources or other electronic apparatus.

It is an object of the present invention to provide a circuit oscillating with the highest possible frequency stability and purity.

It is a further object of the invention to provide an oscillator with at least two outputs with a highly stable and predictable phase relationship.

A further object of the invention is to provide a multiphase signal oscillator, the frequency of which is voltage controllable.

Another object of the invention is to provide means for immediate oscillation start even at extremely low frequencies.

Still another object of the invention is to provide a quadrature oscillator, which substantially simplifies the building of frequency shifters, using quadrature signals, without sacrificing their high performance standards.

In order to provide a multiphase signal or quadrature oscillator with the above specifications, one of the most important considerations is the provision of a circuit, the performance parameters of which are independent of the fluctuating characteristics (aging, temperature drift) of active components.

A further consideration is the provision of a wide tuning range without any performance change.

In known quadrature oscillators of the cascaded integrator type the individual integrator stages are formed by a serial arrangement of a resistor or a current source and an integrating capacitor, the latter one being placed between the output and the inverting input of an operational amplifier, the connecting point between said resistor or current source and said capacitor being at the inverting input of the operational amplifier. This arrangement (a) makes the performance dependent upon an active component, namely the operational amplifier, and (b) each individual integrator stage functions as a low pass filter, in which both the phase and the amplitude and frequency dependent.

In a quadrature oscillator according to this invention, however, a serial arrangement of all-pass filter sections is used with the frequency determining passive components placed so as to operate independent of active components. Therefore, in a circuit configuration according to this invention the performance is (a) not affected by active components, and is (b) amplitude stable due to the all-pass phase filter characteristics, which are typical for a phase change only with the frequency.

Typically, in a quadrature oscillator according to this invention, a serial arrangement of two all-pass phase filter sections with identical phase shift determining resistors and capacitors is used in combination with a serially connected unity gain inverter stage, the output of which feeds into the input of the first all-pass filter section. In this circuit configuration oscillation will occur at precisely the frequency, at which the phase shift for both sections is 90°, which happens, when $R = 1/2\pi fC$ or $f = 1/2\pi RC$, where R is the value of the frequency determining resistors in ohms and C the value of the frequency determining capacitors in farads. In a quadrature oscillator of this type according to the invention means are provided to control the amplitude of the generated signals.

Figure 2:
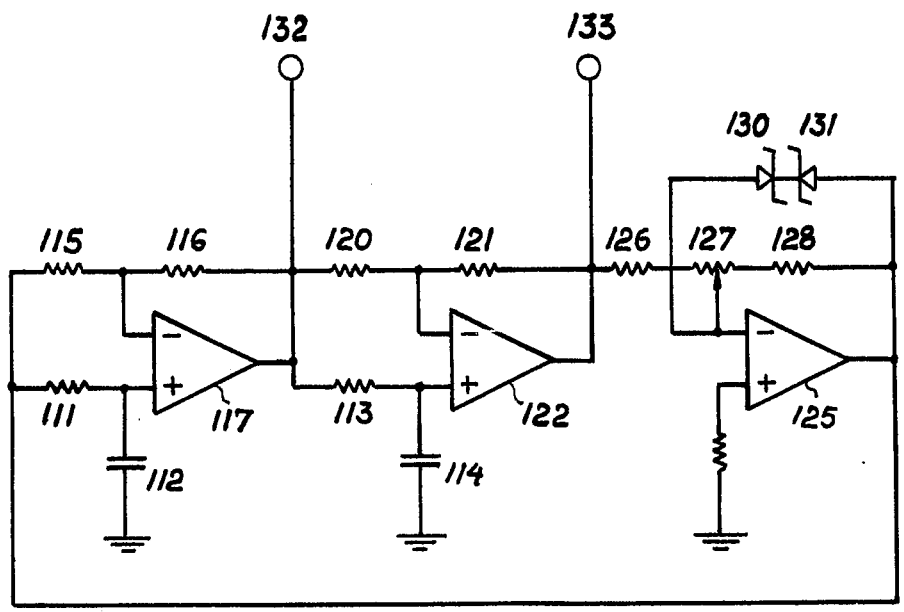
Figure 3:
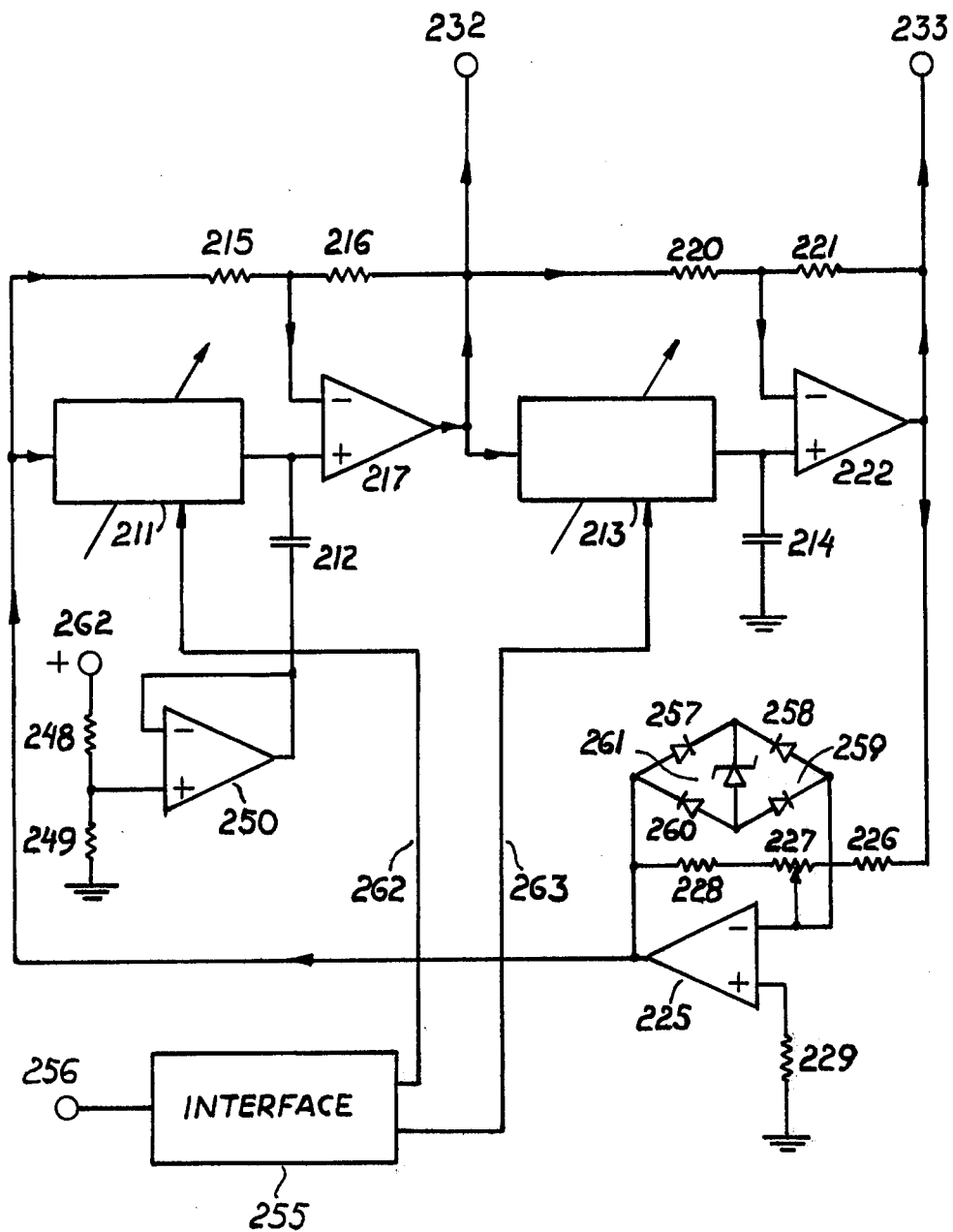
Figure 4:
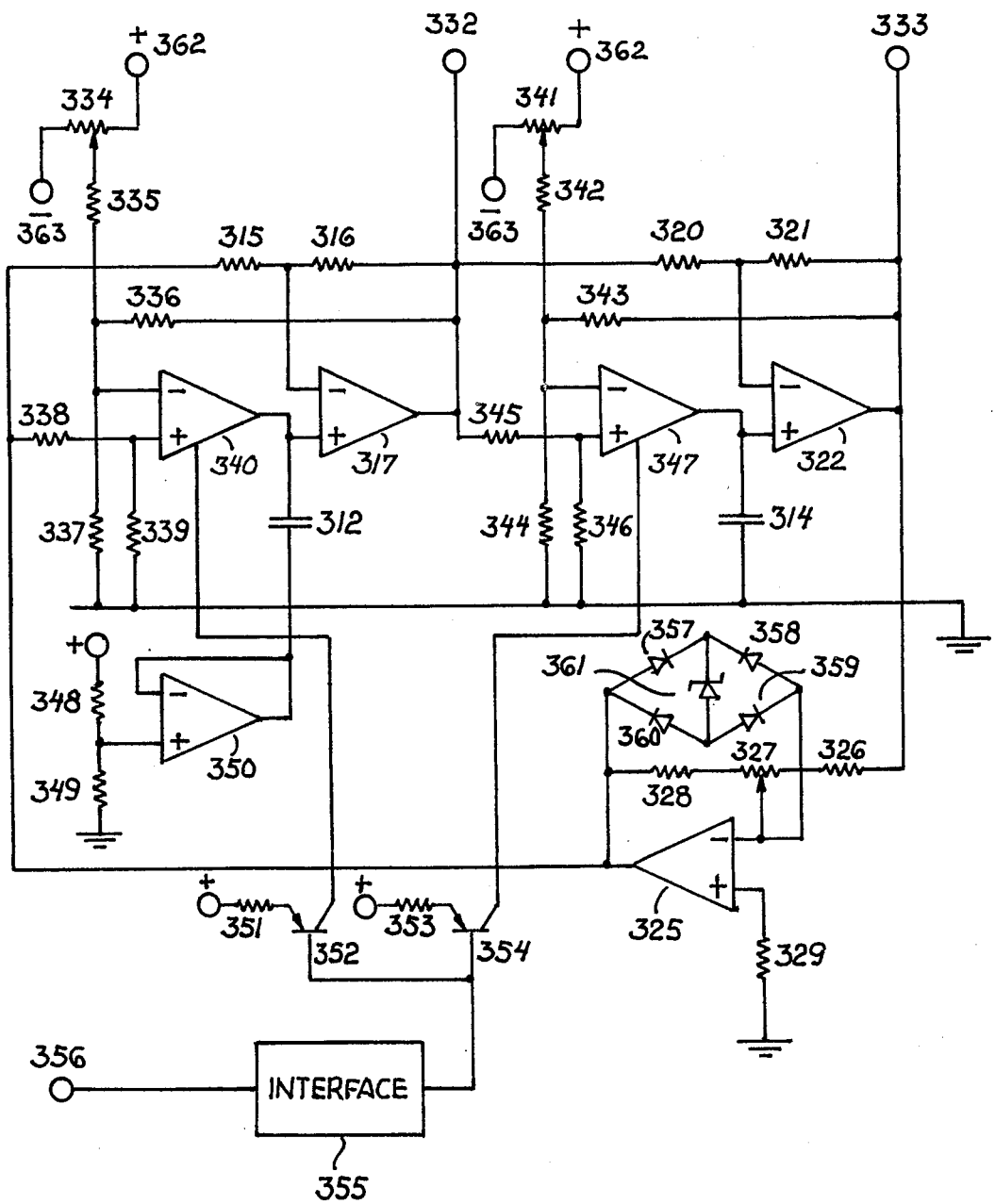

The novel feature of the invention, together with further objects and advantages thereof, will become more readily apparent when considered in connection with the accompanying drawings, in which:

FIG. 1 is a schematic diagram of a quadrature oscillator will all-pass phase filters according to the invention, FIG. 2 is the schematic diagram of a quadrature oscillator according to the invention with a modified all-pass phase filter configuration, FIG. 3 is the schematic diagram of the general concept of a voltage controlled oscillator according to the invention, and FIG. 4 is the schematic diagram of a specific version of a voltage controlled quadrature oscillator according to the invention, using operational transconductance amplifiers for frequency control.

Referring now to the drawings and more particularly to FIG. 1, it will be observed, that numerals 17 and 22 represent two inverting operational amplifiers, which due to the equal values of resistors 15 and 16 chosen for operational amplifier 17 and of resistors 20 and 21 for operational amplifier 22 function as unity gain inverters. Numeral 25 represents another inverting operational amplifier, which due to the equal values of resistors 26 and 28 in conjunction with a smaller potentiometer 27 (for instance one tenth the value of resistors 26 and 28) is adjustable to or close to unity gain. Furthermore in this schematic diagram numerals 19 and 24 represent two voltage followers.

Referring now to the serially connected resistor-capacitor pairs 11, 12 and 13, 14 respectively, and assuming, that the value of resistor 11 equals that of 13, and that the value of capacitor 12 equals that of capacitor 14, then a 90° phase shifted signal will appear at the junctions of resistor 11 and capacitor 12 as well as of resistor 13 and capacitor 14 at the frequency, at which the reactive resistance of the capacitor equals the resistance value of the resistor, or when $R = (1/2\pi fC)$.

At precisely this frequency feedback condition will exist and oscillations will build up providing the fine gain adjustment of inverter 25 is set to compensate for any losses or deviation from unity gain in the remaining stages. In order to limit the amplitude of the oscillation, two back-to-back Zener diodes 30 and 31 are arranged in a known manner in the negative feedback loop of operational amplifier 25. Since the measured Q of an oscillator of this type is very high, (typically several hundred even at frequencies below 1 Hz), the limiting Zener diodes do not cause measurable distortions. As it will be readily recognized, the output signals produced at terminals 32 and 33 will have a 90° phase difference relative to each other.

Another circuit configuration of a quadrature oscillator according to the invention with a different type of a known all-pass phase filter is shown in FIG. 2. Here the numerals 117 and 122 represent two identical operational amplifiers with the associated equal value resistor pairs 115 and 116; and 120 and 121, respectively. The phase determining resistor/capacitor combinations are represented by resistors 111 and 113, and by capacitors 112 and 114.

At very high frequencies, at which capacitors 112 and 114 approach the functions of shunts to ground, the stages with operational amplifiers 117 and 122 approach the function of unity gain inverting stages. In contrast, at very low frequencies, at which the reactive resistance of capacitors 112 and 114 becomes extremely high, the stages with operational amplifiers 117 and 122 approach the function of unity gain non-inverting stages. At a frequency, at which the reactive resistance of capacitor 112 equals the value of resistor 111, and the reactive resistance of capacitor 114 equals the value of resistor 113, the signal at the output of the stage with operational amplifier 117 is phase shifted by 90° relative to the signal at its input, and likewise the signal at the output of the stage with operational amplifier 122 is phase shifted by 90° relative to the signal at its input.

Again, as discussed earlier for the circuit according to FIG. 1, the just described phase shifter stages in FIG. 2 are followed by an inverting operational amplifier 125, which due to the equal values of resistors 126 and 128 in conjunction with a smaller potentiometer 127 (for instance one tenth the value of resistors 126 and 128) is adjustable to or close to unity gain.

Also, as discussed earlier for the circuit according to FIG. 1, feedback condition will exist in the circuit according to FIG. 2 at precisely the frequency, for which the phase shifts in the phase filter stages with operational amplifiers 117 and 122 are 90°; and oscillations will build up providing the fine gain adjustment of inverter 125 is set to compensate for any losses or deviation from unity gain in the remaining stages. Again, two limiting diodes 130 and 131 are provided in the negative feedback loop of the operational amplifier 125 to limit the amplitude of the oscillation.

Referring now to the schematic diagram according to FIG. 3, certain similarities will be recognized with the schematic diagram according to FIG. 2. In FIG. 3 the numerals 217 and 222 refer to the operational amplifiers of the two all-pass filter stages of the circuit with the equal value resistor pairs 215 and 216; and 220 and 221 respectively. Numeral 211 refers to a variable resistor or current source in the stage with operational amplifier 217, and in the same manner numeral 213 refers to a variable resistor or current source in the stage with operational amplifier 222. It will be recognized, that the capacitor 212 in the resistor or current source/capacitor combination with the numerals 211 and 212 is not grounded but referenced to the output of a voltage follower with the operational amplifier 250, which places the reference point (the lower end) of said capacitor 212 at A.C. ground and at the same time at a positive D.C. potential. This is done for the purpose of securing in immediate oscillation start even at extremely low frequencies, in the following manner: The oscillation observed at the junction of resistor or current source 211 and capacitor 212 is a cosine function in contrast to the oscillation observed at the junction of resistor or current source 213 and capacitor 214, which latter one is a sine function. This means, that at the starting point or t = 0 the voltage at the junction of 211 and 212 has a maximum positive value and at the same time the voltage at the junction of 213 and 214 equals zero. If now the equipment with the circuit according to the invention is turned on, the power supply voltage at point 262 will jump to a positive value. Likewise a positive voltage transition of the required magnitude will be derived at the junction of resistors 248 and 249 and fed to the non-inverting input of the voltage follower with the operational amplifier 250, the output voltage of which will be transmitted through capacitor 212 to the junction between this capacitor and the resistor or current source 211. Thus, after turn-on the start of a cosine wave will be facilitated at this point, and a sine wave will start at the junction of resistor or current source 213 and capacitor 214.

Further details of the schematic diagram of FIG. 3 deal with means for changing the variable resistors or current sources 211 and 213, for achieving voltage dependent frequency control, and with the unity gain inverter stage 225 with its associated circuitry for amplitude limitation.

Referring now specifically to the frequency control circuitry, an interface 255 will be recognized, which is connected to the resistors or current sources 211 and 213, and which receives a control voltage through input terminal 256. The interface 255 symbolizes a circuit, which, for instance, translates a linear control voltage received at input 256 into an exponential control current, supplied to the control terminals of variable current sources, such as operational transconductance amplifiers, represented by numerals 211 and 213.

Referring further to the unity gain inverter stage with the operational amplifier 225, a diode network will be recognized, comprising the diodes 257, 258, 259 and 260, and the Zener diode 261. This circuit configuration represents a known arrangement to eliminate the problem of precisely matching two Zener diodes such as identified by numerals 130 and 131 in FIG. 2. The resistors 226 and 228 with the potentiometer 227 are provided for precise adjustment around unity gain. Again, like in the circuit of FIG. 2 the loop gain of the oscillator is adjusted by setting the potentiometer 227 so that oscillations are sustained. At positive half waves at the inverting input of operational amplifier 225 diodes 258 and 260 will become conductive and the amplitude will be limited by Zener diode 261. At negative half waves at the inverting input of operational amplifier 225 diodes 257 and 259 will conduct and amplitude limitation by Zener diode 261 will again take place.

Referring now to the schematic diagram according to FIG. 4, it will be recognized, that the variable resistors identified by numerals 211 and 213 in FIG. 3 have been replaced by operational transconductance amplifiers 340 and 347 with associated circuitry in FIG. 4.

Resistor 336 is arranged between the output of the operational amplifier 317 and the inverting input of the operational transconductance amplifier 340 to provide negative feedback and thus to stabilize the output of 340. Resistor 343 between the output of 322 and the inverting input of 347 stabilizes the output of 347. Typically the resistors 336 and 343 have a relatively high value, for instance 220 kilohms. They are arranged in a voltage divider configuration with the resistors 337 and 344, respectively, which have a relatively low value, for instance 470 ohms. The value of resistor 338 equals that of 336, and the value of resistor 345 equals that of 343. Furthermore resistor 339 has the same value as resistor 337, and resistor 346 has the same value as 344. Thus the operational transconductance amplifiers become unity gain stages and, when neglecting the effect of the capacitors 312 and 314, the signal amplitudes at the outputs of operational amplifiers 317 and 322 would be the same as at the outputs of operational amplifiers 325 (or left side of resistor 338) amd 317 (left side of resistor 345). From this it follows, that the operational transconductance amplifiers 340 and 347 display the same performance as variable resistors.

The operational transconductance amplifiers 340 and 347 are controlled through the transistors 352 and 354 with the associated resistors 351 and 353, respectively, which combinations act as variable current sources and which in turn are controlled through the interface 355 which, for instance, may be a linear-to-exponential function converter, and which receives its control signals through the input terminal 356.

For adjusting the D.C. offset voltages at the outputs of the operational transconductance amplifiers 340 and 347, bias control circuits are provided at their inverting inputs, comprising a relatively high value resistor 335 (for instance 390 kilohms) and a potentiometer 334 for amplifier 340, and resistor 342 (same high value) and potentiometer 341 for amplifier 347.

All other circuit elements of the schematic diagram according to FIG. 4 have the same function as their counterparts in the schematic diagram according to FIG. 3.

With a voltage controlled quadrature oscillator such as described in FIG. 4 tuning ranges in the order of 3 decades or more can be achieved. Evidently the circuit shown in FIG. 4 and described herein can be modified, enhanced and augmented for a number of specific applications. One possible modification would provide a single transistor in lieu of the transistor pair 352 and 354, the collector of which would be connected either directly to the control inputs of the operational transconductance amplifiers 340 and 347, or to the wiper of a balancing potentiometer, the two end terminals of which then would be connected to the control inputs of 340 and 347.

Furthermore it will be evident, that the two output signals of any of the quadrature oscillators described in FIG. 1 through FIG. 4 can be inverted by inverter stages for obtaining a total of four output signals with a phase relationship of 0°, 90°, 180°, and 270°. These signals can be used as control signals for the gain control of four voltage controlled amplifiers to produce a rotating sound effect.

It will also be evident, that a quadrature oscillator such as described herein can be used for a frequency shifter, which operates on the principle of summing the output signals of two four quadrant multipliers, the inputs of which receive one each of two 90° phase related program signals and one each of two 90° phase related quadrature oscillator signals.

Other means for enhancing the performance of an apparatus according to the invention or for modifying or simplifying the circuitry within the scope of the invention will be found by those skilled in the art. Therefore, the invention should not be deemed to be limited to the details of what has been described herein, but it should be rather deemed to be limited only to the scope of the appended claims.

What is claimed is:

1. In a quadrature oscillator having a first and a second 90° phase shifting circuits and a unity gain inverter stage connected in a positive feedback loop, the improvement which comprises said 90° phase shifting circuits each having a pair of operational amplifiers, connected in series with each other, means responsive to a control voltage connected to one of said pair of amplifiers for operating said one amplifier as an operational transconductance amplifier which presents a resistance determined by said control voltage, a capacitor connected to the output of said one amplifier so as to obtain said 90° phase shift at the frequency of oscillation of said oscillator, and a resistor connected between the output of the other of said pair of amplifiers and an input of said one amplifier to provide negative feedback therebetween.

2. The invention as set forth in claim 1 wherein the capacitor of one of said 90° phase shift circuits is connected between said output of said one amplifier, and means for applying a D.C. potential thereto whereby to secure immediate start of oscillation of said oscillator.

3. The invention as set forth in claim 1 wherein said starting means comprises a voltage follower operational amplifier the output of which is connected to said capacitor, means including a voltage divider for providing a reference potential, and the non-inverting input of said voltage follower amplifier being connected to said divider.

4. The invention as set forth in claim 1 wherein said unity gain inverter stage is connected to the input of said first phase shifting circuit through a second resistor, and the output of said first phase shifting stage is connected to the input of said second phase shifting stage through a third resistor, the resistance of the negative feedback providing resistor in said first phase shifting circuit being equal to the resistance of said second resistor, and the resistance of the negative feedback providing resistor in said second phase shifting circuit being equal to the resistance of said third resistor.

5. The invention as set forth in claim 1 wherein said 90° phase shifting circuits each provide an all-pass filter section having an input and an output, said operational transconductance amplifier having a non-inverting input and an inverting input and said other operational amplifier having an inverting and a non-inverting input, the non-inverting input of said transconductance amplifier being connected to the input of said section through an input resistor, the output of said section being the output of said other amplifier, the output of said transconductance amplifier being connected to the non-inverting input of said other amplifier, said negative feedback resistor being connected between the output of said other amplifier and the inverting input of said transconductance amplifier, said negative feedback resistor and said input resistor being of the same relatively high value, resistors of the same relatively low value being connected respectively between the inverting and non-inverting inputs of said transconductance amplifier and ground, and resistors of the same value being connected between the inverting input of said other amplifier and the output of said other amplifier and the input of said section respectively.

6. The invention as set forth in claim 5 wherein said unity gain inverter stage comprises an operational amplifier having a non-inverting input connected to ground and inverting input, a potentiometer having a variable top connected to said inverting input, resistors of equal value connected to opposite ends of said potentiometer and to the output of said inverter stage amplifier and the input of said second phase shifting circuit, respectively, a diode bridge network having one diagonal connected between the inverting input and the output of said unity gain inverter stage, a zener diode connected across the diagonal of said bridge opposite from said one diagonal.

* * * * *